(12) United States Patent
Kato et al.

(10) Patent No.: US 6,261,414 B1
(45) Date of Patent: *Jul. 17, 2001

(54) LAMINATE BASE MATERIAL, METHOD OF PREPARING THE SAME, PREPREG AND LAMINATE

(75) Inventors: Yoshihisa Kato; Takekazu Adachi; Mamoru Murata, all of Nakatsugawa (JP)

(73) Assignee: OJI Paper Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/185,575

(22) Filed: Nov. 4, 1998

(30) Foreign Application Priority Data

Nov. 5, 1997 (JP) .................................................. 9-302669

(51) Int. Cl.⁷ .......................... D21H 13/26; D21H 13/22; D21H 13/10; D21H 25/04; B32B 5/02
(52) U.S. Cl. .................. 162/146; 162/157.3; 162/157.1; 162/165; 162/166; 162/206; 428/474.4; 428/425.3; 428/626
(58) Field of Search .................................... 162/146, 138, 162/157.2, 157.3, 165, 166, 141, 149, 206, 100, 157.1, 157.4; 428/474.4, 411.4, 413, 423.5, 425.3, 476.3, 607, 626, 637, 611.5; 156/307.4

(56) References Cited

U.S. PATENT DOCUMENTS

| | | | | |
|---|---|---|---|---|
| 3,650,102 | * | 3/1972 | Economy et al. | 442/302 |
| 3,716,521 | * | 2/1973 | Economy et al. | 525/505 |
| 3,756,908 | * | 9/1973 | Gross | 162/146 |
| 4,067,769 | * | 1/1978 | Ohtomo et al. | 162/146 |
| 4,079,113 | * | 3/1978 | Kimura et al. | 264/176 |
| 4,268,351 | * | 5/1981 | Henbest et al. | 162/146 |
| 4,698,267 | | 10/1987 | Tokarsky . | |
| 4,729,921 | * | 3/1988 | Tokarsky . | |
| 4,888,091 | * | 12/1989 | Nollen et al. | 162/109 |
| 5,019,603 | * | 5/1991 | Arita et al. | 521/181 |
| 5,076,887 | * | 12/1991 | Hendren | 162/123 |
| 5,089,088 | * | 2/1992 | Hendren et al. | 162/123 |
| 5,126,012 | * | 6/1992 | Hendren et al. | 162/146 |
| 5,436,301 | * | 7/1995 | Nishimura et al. | 525/423 |

FOREIGN PATENT DOCUMENTS

| | | | |
|---|---|---|---|
| 696958 | * | 11/1964 | (CA) . |
| 2 076 033 | | 11/1981 | (GB) . |
| 55-36323 | * | 3/1980 | (JP) . |
| 5-65640 | | 9/1993 | (JP) . |
| 6-143477 | * | 5/1994 | (JP) . |
| 8-508549 | | 9/1996 | (JP) . |
| 9-228289 | | 9/1997 | (JP) . |
| 2 715455 | | 11/1997 | (JP) . |
| 10-131017 | | 5/1998 | (JP) . |

OTHER PUBLICATIONS

JP 5–328492, Dec. 1993 (Abstract only).
JP 53–59781, May 1978 (Abstract only).

* cited by examiner

Primary Examiner—Jose Fortuna
(74) Attorney, Agent, or Firm—Oblon, Spivak, McClelland, Maier & Neustadt, P.C.

(57) ABSTRACT

The present invention relates to a method of producing a laminate base material useful for preparing a prepreg or a laminate for electronic equipment such as printed board. The method comprises the steps of:

(1) preparing a slurry comprising para-aramid fibers and curable phenolic resin fibers;
(2) preparing a sheet from said slurry;
(3) adding a resin binder to said sheet so as to bond the fibers with each other, thereby to form a combined non-woven fabric and
(4) compressing said non-woven fabric under heating.

According to the present invention, a prepreg or laminate is obtained which has an improved high-frequency characteristics and much less warp.

17 Claims, No Drawings

LAMINATE BASE MATERIAL, METHOD OF PREPARING THE SAME, PREPREG AND LAMINATE

BACKGROUND OF THE INVENTION

The present invention relates to a laminate base material made of a combined non-woven fabric mainly comprising aromatic polyamide fibers, and a method of producing it. The present invention also relates to a prepreg and a laminate made of the laminate base material.

As electronic equipment is becoming compact and the density thereof is becoming higher recently, components to be mounted on a printed board are being changed from those of insertion mounting type to surface mounting type and, accordingly, the mounting on the printed board is mainly conducted by the surface mounting method. In this method, the connection reliability between the components such as chips to be mounted on the surface and the printed board is very important. Namely, the coefficients of thermal expansion of both of them should be as close to each other as possible. The coefficient of thermal expansion of the chips of recent thin surface mounting type is $5 \times 10^{-6}/°$ C., and that of laminates prepared by impregnating a non-woven glass cloth with an epoxy resin is about three times as high as this.

The dielectric constant is also to be considered at some points. Usually, the dielectric constant of ordinary FR-4 is about 4.7 to 5.1. Since such a relatively high dielectric constant delays the propagation of the electric pulse of the adjacent signal circuit, excessive signal delay is caused. When the frequency is high, the delay of the signal propagation in the printed board is a serious problem. In such a case, a laminate base material of a low dielectric constant is necessitated. The term "FR-4" indicates a copper-clad laminate for printed boards, which is produced by impregnating sheets of a glass cloth base with an epoxy resin and laminating them (NEMA number of JIS).

Under these circumstances, intensive investigation has been made for the purpose of using laminates, produced by using a non-woven fabric of aromatic polyamide fibers having a negative coefficient of thermal expansion and a low dielectric constant, as the laminates (including metal foil-clad laminates) to be used as the base materials for printed boards. The non-woven fabrics include (1) those prepared by combining a p-phenylene terephthalamide fiber flock with a m-phenylene isophthalamide fibrid to form a sheet and then compressing the sheet under heating [for example, Japanese Patent Publication for Opposition Purpose (hereinafter referred to as "J. P. KOKOKU") No. Hei 5-65640] and (2) those obtained by combining stretched fibers of p-phenylene diphenyl ether terephthalamide with non-stretched fibers of m-phenylene isophthalamide to form a sheet, then bonding the fibers with one another by means of a resin binder and compressing the sheet under heating. The resultant laminate base material is impregnated with a thermosetting resin and compression-molded under heating to obtain the laminate. Usually, a metal foil which is processed into a printed wiring is applied to the laminate in the heat compression molding step to obtain an integral metal foil-clad laminate.

The base material (1) made of the film of the combined p-phenylene terephthalamide fiber flock and the m-phenylene isophthalamide fibrid is highly hygroscopic and, therefore, when it is used for forming a printed board, tan δ and the dielectric constant are increased by the moisture to cause electric problems. Further, since no resin binder is contained therein, a high pressure is necessitated for the compression with a hot roll so as to obtain an intended density, thereby increasing the fluctuation of the density.

On the other hand, although the hygroscopicity of the base material (2) made of the combined sheet comprising stretched fibers of p-phenylene diphenyl ether terephthalamide and non-stretched fibers of m-phenylene isophthalamide is more improved than that of (1), there is a room for a further improvement. In addition, the bonding power of the non-stretched fibers of m-phenylene isophthalamide fibrid by means of a hot roll in the heating/compression process is lower than that of the m-phenylene isophthalamide fibrid. It was found that the difference in the bonding power between them causes a serious warping of the printed board after the heating step.

Attempt was made, therefore, to reduce the hygroscopicity of the thermosetting resin used for the impregnation of the laminate base material so as to reduce the hygroscopicity of the printed board prepared therefrom. However, no remarkable effect on the hygroscopicity of the printed board was obtained because the hygroscopicity of the thermosetting resin is essentially low. In addition, since the warp of the printed board (2) is mainly due to the bonding power of the m-phenylene isophthalamide fibrid, this defect cannot be overcome with the thermosetting resin to be used for the impregnation of the laminate base material.

SUMMARY OF THE INVENTION

Therefore, the object of the present invention is to improve the high-frequency characteristics of the printed board by lowering the hygroscopicity of the laminate base material made of a non-woven fabric mainly comprising aromatic polyamide fibers, thereby controlling the increase of tan δ and dielectric constant. Another object of the invention is to control the warping of the printed board after the heating step.

Thus, the laminate base material having excellent functions suitable for the printed boards while keeping the characteristic negative heat expansion coefficient of the aromatic polyamide fibers can be provided.

After intensive investigation made on the basis of an idea that the hygroscopicity and warping of the printed boards can be improved to levels higher than those of the above-described laminate base materials (1) and (2) by improving the laminate base materials themselves and also by improving the process for producing them, the inventors have completed the present invention.

The laminate base material of the present invention can be obtained by a process comprising the steps of:

(1) preparing a slurry comprising para-aramid fibers and curable phenolic resin fibers;

(2) preparing a sheet from said slurry;

(3) adding a resin binder to said sheet so as to bond the fibers with each other, thereby to form a combined non-woven fabric and (4) compressing said non-woven fabric under heating.

DESCRIPTION OF THE PREFERRED EMBODIMENTS

The phenolic resin fibers, especially novolak-type phenolic resin fibers having a very low hygroscopicity are mixed with the para-aramid fibers to obtain a mixed non-woven fabric which per se has a low hygroscopicity and, as a result, the hygroscopicity of the laminate base material can be lowered.

The novolak-type phenolic resin which is curable or has not yet been completely cured form the fibers thereof which are firmly bonded with each other or with para-aramid fibers by the heat compression process.

The para-aramid fibers usable in the present invention include p-phenylene terephthalamide and p-phenylene diphenyl ether terephthalamide. Although the chemical structures of the p-phenylene terephthalamide and p-phenylene diphenyl ether terephthalamide are different from each other, the fibers of either of them can be used for solving the above-described problem of the present invention.

The term "laminate" herein indicates those obtained by compression-molding two or more prepregs under heating or metal foil-clad moldings prepared therefrom. The laminate further includes a so-called multi-layer plate having printed circuit on the inner layer and the surface layer.

The term "prepreg" herein indicates a sheet obtained by impregnating a base material such as a non-woven fabric impregnated with a thermosetting resin and drying it, which sheet is to be used for forming the laminate.

The term "laminate base material" herein indicates a base material for the above-described laminate, which is to be impregnated with a resin to form a prepreg.

In the laminate base material of the present invention, the phenolic resin fibers are firmly bonded to each other and also to the para-aramid fibers and, in addition, these fibers are bonded to each other by means of the resin binder. Even when the resin binder is softened to loosen the adhesion thereof to the fibers, the bonding of the fibers to one another is not loosened and kept as it is because the fibers themselves are bonded to one another.

Thus, even when the thermosetting resin penetrating the base material is molten and fluidized by the heat and pressure in the step of forming the laminate, the bonding of the fibers constituting the base material is kept and the base material can be prevented from uneven deformation. Also, when leadless chip components are to be soldered on a printed board, prepared from the laminate (metal foil-clad laminate), by the surface mounting method, the behavior of the substrate such as uneven stretch or shrink is controlled.

In addition, since the phenolic resin having a lower hygroscopicity is incorporated into the laminate base material, the hygroscopicity of the material becomes low. As a result, the hygroscopicity of the printed board is reduced and the increase in tan δ and dielectric constant can also be controlled.

In the non-woven fabrics of the combination of the para-aramid fibers and the phenolic resin fibers, the fibers are bonded to one another by means of the resin binder (such as epoxy resin). The phenolic resin fibers should be desirably in a curable state, such as an uncured or semi-cured state, or in other words, the curing is not yet completed, in the stage of slurry. Namely, it is desirable to progress the curing of the phenolic resin by the compression under heating to bond these fibers to one another or to bond them to the para-aramid fibers.

When the curing of the phenolic resin fibers have excessively proceeded prior to the compression under heating, the bonding of the fibers to one another is weakened and a high pressure is necessitated for compressing the base material to a predetermined density, which increases the density fluctuation. The higher the phenolic resin fiber content, the better from the viewpoints of increasing the bonding of the fibers to one another and reducing the hygroscopicity of the laminate base material. On the contrary, the lower the novolak-type phenolic resin fiber content, the better from the viewpoints of its matching to the thermal expansion coefficient of the leadless chip elements. The novolak-type phenolic resin fiber content is preferably 5 to 35% by weight, much preferably 10 to 25% by weight.

Further, a curing agent is usable for accelerating the curing of the phenolic resin. The curing agent which is not particularly limited is preferably hexamethylenetetramine or a resol-type phenolic resin. When hexamethylenetetramine is used, 3 to 20% by weight, preferably 5 to 10% by weight, based on the phenolic resin fibers, is enough for accelerating the curing of the phenolic resin in the heat compression process.

The effect of the curing agent in accelerating the curing of the phenolic resin in the heat compression step can be obtained by incorporating the curing agent into the mixture or by the coating or impregnation thereof in the course of the wet sheet-forming process, or by coating or impregnation thereof before or in the course of the heating/compression process.

The resin binder content of the mixed non-woven fabric is preferably in the range of 5 to 25% by weight, much preferably 10 to 20% by weight based on the fabric. When the resin binder content of the mixed non-woven fabric is below 5% by weight, the bonding of the fibers to one another in the non-woven fabric is weak. Therefore, this lower limit of the resin binder content is to be noted so as to impart a sufficient strength to non-woven fabric in the heating/compression process with a hot roll. On the contrary, when the resin binder content of the mixed non-woven fabric is above 25% by weight, the adhesion of the fibers, constituting the base material, to one another is loosened and the thermosetting resin impregnated into the base material is molten and fluidized by the heat and pressure in the molding step of forming the laminate. In this step, the uneven deformation of the base material is accelerated. Therefore, this upper limit is to be noted. In addition, when the resin binder content is above this upper limit and the heating/compression process is conducted with hot rolls, the resin binder adheres to the hot rolls and the base material surface becomes fuzzy.

The resin binders usable in the present invention include epoxy resins, melamine resins, phenolic resins, polyimide resins and polyester resins, but the binders are not limited to them.

Prepregs and laminates are prepared from the laminate base material of the present invention as follows: The base material obtained by the present invention is impregnated with a thermosetting resin such as an epoxy resin free of impurities and having a high electric resistance, and the base material thus treated is dried and thereby cured to form a prepreg. Then, a pile of two or more sheets of the prepreg is heated under pressure to form a laminate. Usually, a metal foil such as copper foil is applied thereto to form a metal foil-clad laminate.

The embodiments of the combined non-woven fabric obtained by forming a sheet from a slurry of para-aramid fibers and phenolic resin fibers by the wet method and bonding the fibers to one another with a resin binder (such as epoxy resin) in the heating/compression step are as follows: The diameter and length of the para-aramid fibers are desirably 5 to 15 μm, and not longer than 6 mm, preferably 2 to 5 mm, respectively, and those of the phenolic resin fibers are desirably 10 to 20 μm, preferably 12 to 18 μm, and not longer than 10 mm, preferably 2 to 8 mm, respectively.

The diameter of the para-aramid fibers is desirably small so as to increase the number of intertwining portions of the fibers in the combined non-woven fabric and also to obtain a high strength of this fabric. However, the larger the diameter of the fibers, the better from the viewpoint of the dispersibility of the slurry in the course of forming the sheets. Thus, the diameter of the para-aramid fibers is suitably controlled. As the length of the para-aramid fibers is increased, the number of intertwining portions of the fibers is increased. This is effective from the viewpoint of the strength of the combined non-woven fabric. On the contrary, in view of the dispersibility in the slurry in the sheet-forming step, the shorter the fiber length, the better. Thus, the length of the para-aramid fibers is suitably controlled.

The bonding of the phenolic resin fibers to one another or the bonding of the phenolic resin fibers to the para-aramid fibers is conducted by the heating/compression process. Namely, the non-woven fabric formed as described above is passed through hot rolls to soften the phenolic resin fibers and also to proceed the curing of the phenolic resin fibers. The non-woven fabric is heated at a temperature at which it does not adhere to the hot rolls, and then compressed. Thus, the phenol resin fibers are bonded to one another or these fibers are bonded to the para-aramid fibers and the curing of the phenol resin fibers proceeds.

The slurry is prepared by suspending para-aramid fibers and phenolic resin fibers in a medium such as water by mixing or dispersing the mixture thereof.

The content of the fibers in the slurry is preferably 0.01 to 3% by weight, much preferably 0.1 to 1% by weight of the slurry.

The sheet can be prepared by an ordinary paper machine such as cylinder paper machine, fourdrinier paper machine, inclined former or twin-wire paper machine, from the slurry.

The resultant wet sheet contains a water content of 30 to 70% by weight.

The binder is preferably added to the wet sheet. Then, the sheet is transferred to the drier, for example, multi cylinder drier or yankee drier or air drier. The resultant dried sheet contains a water content of 1 to 5% by weight.

The curing agent for the phenolic resin fibers may be added to the slurry or the sheet made from the slurry. The curing agent may be added by spraying, impregnating or coating the curing agent or a solution or suspension or liquid containing the curing agent to the sheet. The curing agent may be added at any step until the compression step, such as during the sheet forming step. Preferably, the curing agent may be added together with a binder, or may be added after a drier.

Then, the sheet is compressed under heating to prepare a base material. The compression may be carried out with hot rolls conducted only once. However, it is preferred to conduct the compression step twice, either continuously or discontinuously in view of the uniformity of the thickness of the obtained base material, the adhesion to the hot rolls and the fuzziness of the base material. The term "continuously" used herein indicates that the non-woven fabric once passed through the primary hot rolls is then passed through the secondary hot rolls within a time of as short as about 10 seconds or less. The term "discontinuously" used in herein indicates that the non-woven fabric passed through the primary hot rolls is once rolled, and then it is passed through the secondary hot rolls.

In the primary hot roll process, it is suitable that the temperature is 150 to 250° C., preferably 200 to 250° C., and the linear pressure is 120 to 300 kgf/cm, preferably 150 to 250 kgf/cm. The hot roll temperature of 150° C. or higher is preferable, in view of softening and bonding of the phenol resin fibers and also of proceeding of the curing of the novolak-type phenolic resin fibers. The hot roll temperature of 250° C. or lower is preferable, because the adhesion of the softened phenolic resin fibers to the hot rolls is prevented and the workability is not reduced. The hot roll temperature of about 200° C. is preferable because the resin binder is cured which bonds the phenolic resin fibers to the para-aramid fibers. When the curing of the resin binder is insufficient, it sticks to the hot rolls in the second hot roll treatment step and the base material becomes fuzzy. Thus, the temperature should be carefully selected.

In the secondary hot roll treatment, it is suitable that a temperature is 250 to 350° C., preferable 300 to 350° C. and a linear pressure is 120 to 300 kgf/cm, preferably 150 to 250 kgf/cm. The hot roll temperature of 250° C. or higher is preferable in view of softening of the novolak-type phenolic resin fibers which have been cured in the first hot roll treatment. At the roll temperature of higher than 350° C., the fiber mixture is apt to adhere to the hot rolls because of the softened novolak-type phenolic resin fibers, and the surface of the base material is apt to become fuzzy. Thus, the temperature should be carefully selected. The compression in the primary and secondary hot roll treatments is conducted between a pair of hot rolls. The linear pressure indicates the pressure per a roll width of 1 cm. Although the moving rate of the non-woven fabric is not particularly limited, 10 m/min or less is desirable because the non-woven fabric should gain a predetermined quantity of heat as it passes through the hot rolls.

The following Examples will further illustrate the present invention, which by no means limit the scope of the present invention. Unless otherwise stated, parts and percentages of the effective components are given by weight.

EXAMPLES 1, 4 TO 10

A sheet (water content of 50% by weight) was formed by inclined former type paper machine from a slurry (fiber content of 0.2% by weight) containing para-aramid fibers in water [fiber diameter: 12 $\mu$m, fiber length: 3 mm, Technora (a product of Teijn Ltd.)] and novolak-type phenolic resin fibers [fiber diameter: 14 $\mu$m, fiber length: 6 mm, softening point: 90° C., KYNOL (a product of NIPPON KYNOL, uncured type] as the uncured phenolic resin fibers. An emulsion containing a water-dispersed epoxy resin (glass transition temperature: 110° C.) as the resin binder and hexamethylenetetramine as the curing agent was sprayed onto the sheet and then drying it by heating (140° C. drum drier), to prepare a combined non-woven fabric mainly comprising the aromatic polyamide fibers and having a unit weight of 72 g/m$^2$. The relative amounts of the para-aramid fibers, phenolic resin fibers and resin binder in the obtained non-woven fabric were as shown in Table 1. The non-woven fabric was heated and compressed by passing it through the primary and secondary pairs of hot rolls under the conditions (linear pressure and roll temperature) shown in Table 2 to soften the phenolic resin fibers and also to proceed the binding and curing. The moving rate of the combined non-woven fabric was fixed at 10 m/min.

EXAMPLE 2

A sheet (water content of 50% by weight) was formed from a slurry (fiber content of 0.2% by weight) containing para-aramid fibers in water [fiber diameter: 10 $\mu$m, fiber length: 3 mm, Technora (product of Teijin Ltd.)] and novolak-type phenolic resin fibers [fiber diameter: 14 $\mu$m, fiber length: 6 mm, softening point: 90° C., KYNOL (a product of NIPPON KYNOL), uncured type]. An emulsion containing a water-dispersed epoxy resin (glass transition temperature: 110° C.) as the resin binder and hexamethylenetetramine as the curing agent was sprayed onto the sheet and then drying it by heating, to prepare a combined non-woven fabric mainly comprising the aromatic polyamide fibers and having a unit weight of 72 g/m². The relative amounts of the para-aramid fibers, phenolic resin fibers and resin binder in the obtained non-woven fabric were as shown in Table 1. The non-woven fabric was heated and compressed by passing it through the primary and secondary pairs of hot rolls under the conditions (linear pressure and roll temperature) shown in Table 2 to soften the phenolic resin fibers and also to proceed the bonding and curing. The moving rate of the combined non-woven fabric was fixed at 10 m/min.

EXAMPLE 3

A sheet (water content of 50% by weight) was formed from a slurry (fiber content of 0.2% by weight) containing para-aramid fibers [fiber diameter: 12 μm, fiber length: 6 mm, Technora (a product of Teijin Ltd.)] and novolak-type phenolic resin fibers [fiber diameter: 14 μm, fiber length: 6 mm, softening point: 90° C., KYNOL (a product of NIPPON KYNOL), uncured type]. An emulsion containing a water-dispersed epoxy resin (glass transition temperature: 110° C.) as the resin binder and hexamethylenetetramine as the curing agent was sprayed onto the sheet and then drying it by heating, to prepare a combined non-woven fabric mainly comprising the aromatic polyamide fibers and having a unit weight of 72 g/m². The relative amounts of the para-aramid fibers, phenolic resin fibers and resin binder in the obtained non-woven fabric were as shown in Table 1. The non-woven fabric was heated and compressed by passing it through the primary and secondary pairs of hot rolls under the conditions (linear pressure and roll temperature) shown in Table 2 to soften the phenolic resin fibers and also to proceed the bonding and curing. The moving rate of the combined non-woven fabric was fixed at 10 m/min.

Comparative Example 1

A sheet (water content of 50% by weight) was formed from a slurry (fiber content of 0.2% by weight) containing para-aramid fibers [fiber diameter: 12 μm, fiber length: 3 mm, Technora (a product of Teijin Ltd.)] and chopped meta-aramid fibers [fiber diameter: 3 denier, fiber length: 6 mm, softening point: 280° C., Conex (a product of Teijin Ltd.), unstretched type]. A non-woven fabric made of the aromatic polyamide fibers and having a unit weight of 72 g/m² was prepared by spraying a water-dispersed epoxy resin (glass transition temperature: 110° C.) as the resin binder. The relative amounts of the para-aramid fibers, meta-aramid fibers and resin binder in the obtained non-woven fabric were as shown in Table 1. The non-woven fabric was heated and compressed by passing it through the primary and secondary pairs of hot rolls under the conditions (linear pressure and roll temperature) shown in Table 2 to conduct the heat fusion or deformation of the meta-aramide fibers. The moving rate of the non-woven fabric made of the aromatic polyamide fibers was fixed at 10 m/min.

Comparative Example 2

A laminate base material was prepared in the same manner as that of Comparative Example 1 except that the chopped meta-aramid fibers were replaced with phenolic resin fibers [fiber diameter: 14 μm, fiber length: 6 mm, KYNOL (a product of NIPPON KYNOL), cured type] as the cured phenolic resin fibers.

Comparative Example 3

A sheet (water content of 50% by weight) was formed from only para-aramid fibers [fiber diameter: 12 μm, fiber length: 3 mm, Technora (a product of Teijin Ltd.)]. A non-woven fabric made of the aromatic polyamide fibers and having a unit weight of 72 g/m² was prepared by spraying a water-dispersed epoxy resin (glass transition temperature: 110° C.) as the resin binder and heating and drying the sheet. The relative amounts of the para-aramid fibers and resin binder in the obtained non-woven fabric of the aromatic polyamide fibers were as shown in Table 1. The non-woven fabric of the aromatic polyamide fibers was heated and compressed by passing it through the primary and secondary pairs of hot rolls under the conditions (linear pressure and roll temperature) shown in Table 2 to conduct the deformation. The moving rate of the non-woven fabric made of the aromatic polyamide fibers was fixed at 10 m/min.

Formation of Prepregs and Laminates (Examples and Comparative Examples)

Each of the laminate base materials prepared as described above was impregnated with a brominated bisphenol A-type epoxy resin varnish and then dried to obtain a prepreg having an attached resin content of 50% by weight. Five plies of the prepregs were laminated and a 18 μm copper foil was applied to both of the surfaces of the obtained laminate. After the heating/compression molding, a copper-clad laminate having a thickness of 0.5 mm was obtained.

The fibers Technora (a product of Teijin Ltd.) were p-phenylene diphenyl ether terephthalamide fibers among the para-aramid fibers.

TABLE 1

| | | | | (Composition) | | | | | |
| --- | --- | --- | --- | --- | --- | --- | --- | --- | --- |
| | | | | | Composition of base material | | | Para-aramid fibers | |
| | Basis wt. of sheet (g/m²) | *Curing agent (part/base material) | *Binder (part/base material) | Para-aramid (%) | Meta-aramid (%) | Uncured phenol (%) | Cured phenol (%) | Fiber diameter (μm) | Fiber length (mm) |
| Comp. Ex. 1 | 70 | 0 | 15 | 80 | 20 | | | 12 | 3 |
| Comp. Ex. 2 | 70 | 0 | 15 | 80 | | | 20 | 12 | 3 |
| Comp. Ex. 3 | 70 | 0 | 15 | 100 | | | | 12 | 3 |
| Ex. 1 | 70 | 1.5 | 15 | 80 | | 20 | | 12 | 3 |
| Ex. 2 | 70 | 1.5 | 15 | 80 | | 20 | | 10 | 3 |
| Ex. 3 | 70 | 1.5 | 15 | 80 | | 20 | | 12 | 6 |
| Ex. 4 | 70 | 0.8 | 15 | 90 | | 10 | | 12 | 3 |

TABLE 1-continued (Composition)

| | | | | Composition of base material | | | | Para-aramid fibers | |
|---|---|---|---|---|---|---|---|---|---|
| | Basis wt. of sheet (g/m$^2$) | *Curing agent (part/base material) | *Binder (part/base material) | Para-aramid (%) | Meta-aramid (%) | Uncured phenol (%) | Cured phenol (%) | Fiber diameter (μm) | Fiber length (mm) |
| Ex. 5 | 70 | 2.3 | 15 | 70 | | 30 | | 12 | 3 |
| Ex. 6 | 70 | 1.5 | 10 | 80 | | 20 | | 12 | 3 |
| Ex. 7 | 70 | 1.5 | 20 | 80 | | 20 | | 12 | 3 |
| Ex. 8 | 70 | 1.5 | 15 | 80 | | 20 | | 12 | 3 |
| Ex. 9 | 70 | 1.5 | 15 | 80 | | 20 | | 12 | 3 |
| Ex. 10 | 70 | 1.5 | 15 | 80 | | 20 | | 12 | 3 |

*Curing agent: hexamethylenetetramine
*Binder: epoxy resin

TABLE 2

(Preparation conditions and results)

| | Roll temp. | | Roll pressure | | Stain of roll | Warp of laminate | Hygro-scopicity | Thermal expansion coefficient |
|---|---|---|---|---|---|---|---|---|
| | Primary (° C.) | Secondary (° C.) | Primary (kg/cm) | Secondary (kg/cm) | — | — | — | — |
| Comp. Ex. 1 | 220 | 330 | 200 | 220 | ⊚ | X | 0.67 | ⊚ |
| Comp. Ex. 2 | 220 | 330 | 200 | 220 | ⊚ | X | 0.42 | ⊚ |
| Comp. Ex. 3 | 220 | 330 | 200 | 220 | ⊚ | XX | 0.51 | ⊚ |
| Ex. 1 | 220 | 330 | 200 | 220 | ⊚ | ⊚ | 0.31 | ⊚ |
| Ex. 2 | 220 | 330 | 200 | 220 | ⊚ | ⊚ | 0.28 | ⊚ |
| Ex. 3 | 220 | 330 | 200 | 220 | ⊚ | ⊚ | 0.32 | ⊚ |
| Ex. 4 | 220 | 330 | 200 | 220 | ⊚ | ⊚ | 0.42 | ⊚ |
| Ex. 5 | 220 | 330 | 200 | 220 | ○ | ⊚ | 0.22 | ○ |
| Ex. 6 | 220 | 330 | 200 | 220 | ⊚ | ⊚ | 0.32 | ⊚ |
| Ex. 7 | 220 | 330 | 200 | 220 | ○ | ○ | 0.30 | ⊚ |
| Ex. 8 | 130 | 330 | 200 | 220 | ○ | ○ | 0.31 | ⊚ |
| Ex. 9 | 280 | 330 | 200 | 220 | ○ | ○ | 0.32 | ⊚ |
| Ex. 10 | 220 | 200 | 200 | 220 | ○ | ○ | 0.29 | ⊚ |

Evaluation Method and Criteria
Stain of Roll

The degree of staining of the rolls was macroscopically determined in the course of the preparation. The evaluation was made according to the following criteria.

⊚ very slight
○ slight
Δ a little
x serious

Warp of Laminate

The height of the warp at ends of each sample was measured in the steps: original state→150° C.×30 minutes→230° C. 10 minutes. The evaluation was made according to the following criteria.

⊚ very slight
○ slight
Δ partially serious
x serious

Hygroscopicity

The hygroscopicity was determined according to the following formula:

[(Basis weight in hygroscopic state)−(basis weight in absolutely dry state)]/(basis weight in hygroscopic state)×100%.

In this case, the basis weight in hygroscopic state was determined after leaving the sample at 30° C. in a relative humidity of 80% for 60 days.

Thermal Expansion Coefficient

The coefficient is determined by TMA (thermal mechanical analysis). In this method, a non-vibrational load is applied and the deformation of the substance is employed as the function of temperature. The evaluation was made according to the following criteria.

⊚ very low
○ low
Δ high
x very high

As described above, according to the present invention, the combined non-woven fabric is prepared from para-aramid fibers and novolak-type phenolic resin fibers, wherein the fibers are bonded to one another with a resin binder and the novolak-type phenolic resin fibers are bonded to one another or they are bonded to the para-aramid fibers, and the fabric is used as the laminate base material. Thus, the warp of the laminate molded from this base material or of the printed board prepared therefrom can be made smaller than that caused when para-aramid fibers and meta-aramid fibers are used as starting materials for the laminate base material.

In addition, since the novolak-type phenolic resin fibers having a hygroscopicity lower than that of the meta-aramid fibers are used, the hygroscopicity of the combined non-woven fabric per se can be reduced to a level lower than that of the combined non-woven fabric of the para-aramid fibers and meta-aramid fibers. Thus, the increase in tan δ and dielectric constant can be controlled. Thus, the novolak-type phenolic resin fibers are suitably used for preparing high frequency appliances. The amount of the novolak-type phenolic resin fibers is limited to 5 to 35% by weight. When it is not larger than 35% weight, the characteristic negative heat expansion factor of the aromatic polyamide fibers is utilized so that the thermal expansion coefficient of the laminate will match with that of leadless chip elements.

What is claimed is:

1. A method of producing a laminate base material, comprising the steps of:
   (1) preparing an aqueous slurry comprising para-aramid fibers and curable but uncured phenolic resin fibers;
   (2) preparing a sheet from said slurry;
   (3) adding a resin binder to said sheet so as to bond the fibers with each other, thereby to form a combined non-woven fabric and
   (4) compressing said non-woven fabric under heating, wherein a curing agent for said phenolic resin fibers is added at any step until said compression step,
   wherein said phenolic resin fibers are novolak-type phenol.

2. The method of claim 1, wherein said sheet contains a curing agent for said phenolic resin fibers.

3. The method of claim 2, wherein said curing agent is selected from the group consisting of hexamethylenetetramine and a resol-type phenolic resin.

4. The method of claim 2, wherein said curing agent is incorporated into said sheet before the compression step.

5. The method of claim 4, wherein said resin binder is an epoxy resin.

6. The method of claim 5, wherein said resin binder is used in an amount of 5 to 25% by weight of the total weight of the fibers contained in said sheet.

7. The method of claim 1, wherein said para-aramid fibers are p-phenylene terephthalamide fibers or p-phenylene diphenyl ether terephthalamide fibers.

8. The method of claim 1, wherein said phenolic resin fibers are curable in said slurry.

9. The method of claim 1, wherein said para-aramid fibers are used in an amount of 65 to 95% by weight based on the total weight of the fibers.

10. The method of claim 1, wherein said phenolic resin fibers are used in an amount of 5 to 35% by weight, based on the total amount of the fibers.

11. The method of claim 1, wherein said curing agent is used in an amount of 3 to 20% by weight of said phenolic resin fibers.

12. The method of claim 1, wherein said compression step is conducted with hot rolls at a roll temperature of 150 to 350° C. under a linear pressure of the rolls of 120 to 300 kgf/cm.

13. The method of claim 1, wherein said compression step is carried out in twice.

14. The method of claim 13, wherein said compression step comprises a primary hot roll process and a secondary hot roll process, wherein the roll temperature is 150 to 250° C. and the linear pressure of the rolls is 120 to 300 kgf/cm in said primary hot roll process, and wherein the roll temperature is 250 to 350° C. and the linear pressure of the rolls is 120 to 300 kgf/cm in said secondary hot roll process.

15. The method of claim 14, wherein said primary hot roll process and the secondary hot roll process are conducted continuously or discontinuously.

16. A prepreg obtained by impregnating a laminate base material with a thermosetting resin and drying it, wherein said laminate base material is obtained by the method claimed in any of claims 1 to 15.

17. A laminate prepared by compression-molding the prepreg claimed in claim 16 under heating.

* * * * *